(12) United States Patent
Chen et al.

(10) Patent No.: US 8,584,052 B2
(45) Date of Patent: Nov. 12, 2013

(54) CELL LAYOUT FOR MULTIPLE PATTERNING TECHNOLOGY

(75) Inventors: Huang-Yu Chen, Zhudong Township (TW); Yuan-Te Hou, Hsin-Chu (TW); Ken-Hsien Hsieh, Taipei (TW); Ru-Gun Liu, Hsin-Chu (TW); Lee-Chung Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/084,255

(22) Filed: Apr. 11, 2011

(65) Prior Publication Data

US 2012/0167021 A1 Jun. 28, 2012

Related U.S. Application Data

(60) Provisional application No. 61/426,270, filed on Dec. 22, 2010.

(51) Int. Cl.
*G06F 17/50* (2006.01)
(52) U.S. Cl.
USPC .................. 716/50; 716/51; 716/52; 716/53; 716/54; 716/55; 430/5; 430/30

(58) Field of Classification Search
USPC ............... 716/118–119, 122, 135, 139, 5–55; 430/5, 30
See application file for complete search history.

(56) References Cited

U.S. PATENT DOCUMENTS

| | | | |
|---|---|---|---|
| 5,798,541 A | 8/1998 | Jassowski | |
| 6,924,071 B1 * | 8/2005 | Buck | 430/30 |
| 7,378,195 B2 * | 5/2008 | Graur et al. | 430/5 |
| 7,873,929 B2 * | 1/2011 | Kahng et al. | 716/118 |
| 8,281,262 B2 * | 10/2012 | Aton | 716/50 |
| 2008/0222587 A1 * | 9/2008 | Smayling et al. | 716/7 |
| 2010/0115484 A1 | 5/2010 | Frederick | |
| 2010/0196803 A1 * | 8/2010 | Lu et al. | 430/5 |
| 2010/0199253 A1 * | 8/2010 | Cheng et al. | 716/13 |
| 2010/0281446 A1 | 11/2010 | Hou et al. | |

* cited by examiner

*Primary Examiner* — Nghia Doan
(74) *Attorney, Agent, or Firm* — Slater & Matsil, L.L.P.

(57) ABSTRACT

A system and method for providing a cell layout for multiple patterning technology is provided. An area to be patterned is divided into alternating sites corresponding to the various masks. During a layout process, sites located along a boundary of a cell are limited to having patterns in the mask associated with the boundary site. When placed, the individual cells are arranged such that the adjoining cells alternate the sites allocated to the various masks. In this manner, the designer knows when designing each individual cell that the mask pattern for one cell will be too close to the mask pattern for an adjoining cell.

19 Claims, 8 Drawing Sheets

CELL LAYOUT FOR MULTIPLE PATTERNING TECHNOLOGY

This application claims the benefit of U.S. Provisional Application Ser. No. 61/426,270, filed on Dec. 22, 2010, entitled "Cell Layout for Multiple Patterning Technology," which application is hereby incorporated herein by reference.

BACKGROUND

In photolithographic systems, there is a need to achieve a high resolution in order to resolve fine, high density, high-resolution patterns. In a photolithographic system employed in the integrated circuit (IC) industry, light is projected onto a resist for the purpose of patterning an electronic device. Significant improvement in the resolution of photolithographic systems has been one of the most important enablers for the manufacture of high density and high speed semiconductor IC chips.

Generally, the resolution of a photolithographic system is dependent upon, among other things, the wavelength of the light. The wavelength has been progressively reduced from the mercury G-line (436 nm) to the ArF excimer laser line (193 nm), and further to 157 nm and possibly into the extreme-ultraviolet (EUV) wavelengths. Other techniques, such as phase-shifting masks, off-axis illumination, immersion lithography, and the like, have led to further reductions. However, these techniques of improving the resolution are approaching physical and technical limits.

In order to push the lithographic limit further and to create even smaller, more densely packed devices, multiple patterning technology (MPT) techniques are being developed. The multiple patterning technology decomposes layout patterns into sub-patterns and then uses two or more masks to print each sub-pattern. The interaction between these sub-patterns may, however, create a cell abutting problem for both standard cell designers and placement EDA (Electronic Design Automation) tools. Cell abutting problems may arise, for example, when two sub-patterns have objects assigned to the same mask along a cell boundary such that when the cells are positioned next to each other, the objects are too close to each other for the objects to be adequately defined by a single mask.

Previous attempts to reduce or resolve the cell abutting problems of the multiple patterning technology comprise including large buffer zones in standard cell boundaries or imposing cell abutting constraints into the placement tools. Inserting large buffer zones in standard cell boundaries may suffer an area penalty, while imposing complex cell abutting constraints into placement tools may suffer quality degradation, such as ineffective timing optimization and low utilization rate (area penalty).

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
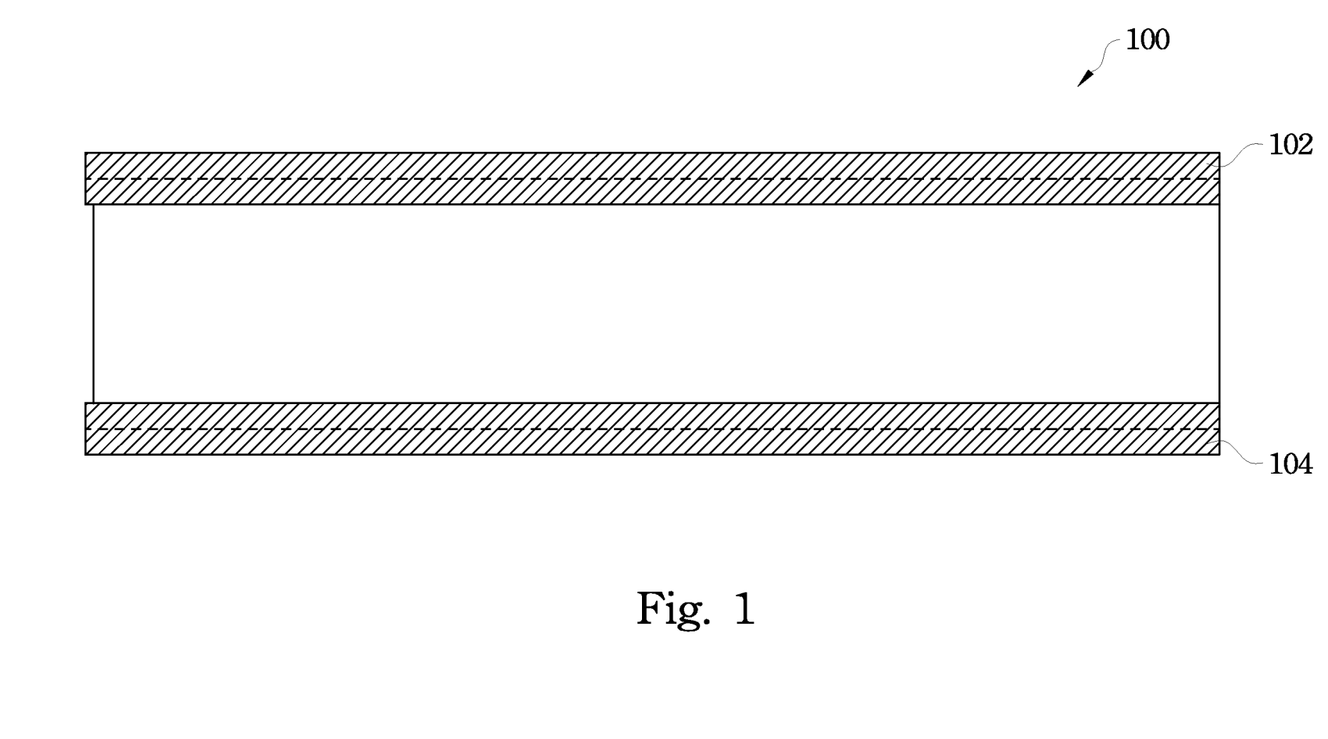
FIGS. 1-4 illustrate steps of a cell layout process in accordance with an embodiment.

FIGS. 1-4 illustrate a process of cell placement in accordance with an embodiment. Referring first to FIG. 1, there is shown a placement area 100 to be laid out with various cells. The cells (discussed below with reference to FIGS. 2-4) may represent any functional block of circuitry, lines, vias, or the like requiring patterning and may be located on a substrate (e.g., poly layer) or a metallization layer. For example, the cell may represent circuitry and or lines associated with a memory cell, a sense amplifier, power circuitry, or the like. It should be noted that the placement area 100 may include one or more predefined elements, such as a $V_{dd}$ line 102 and a $V_{ss}$ line 104.

Figure 2:
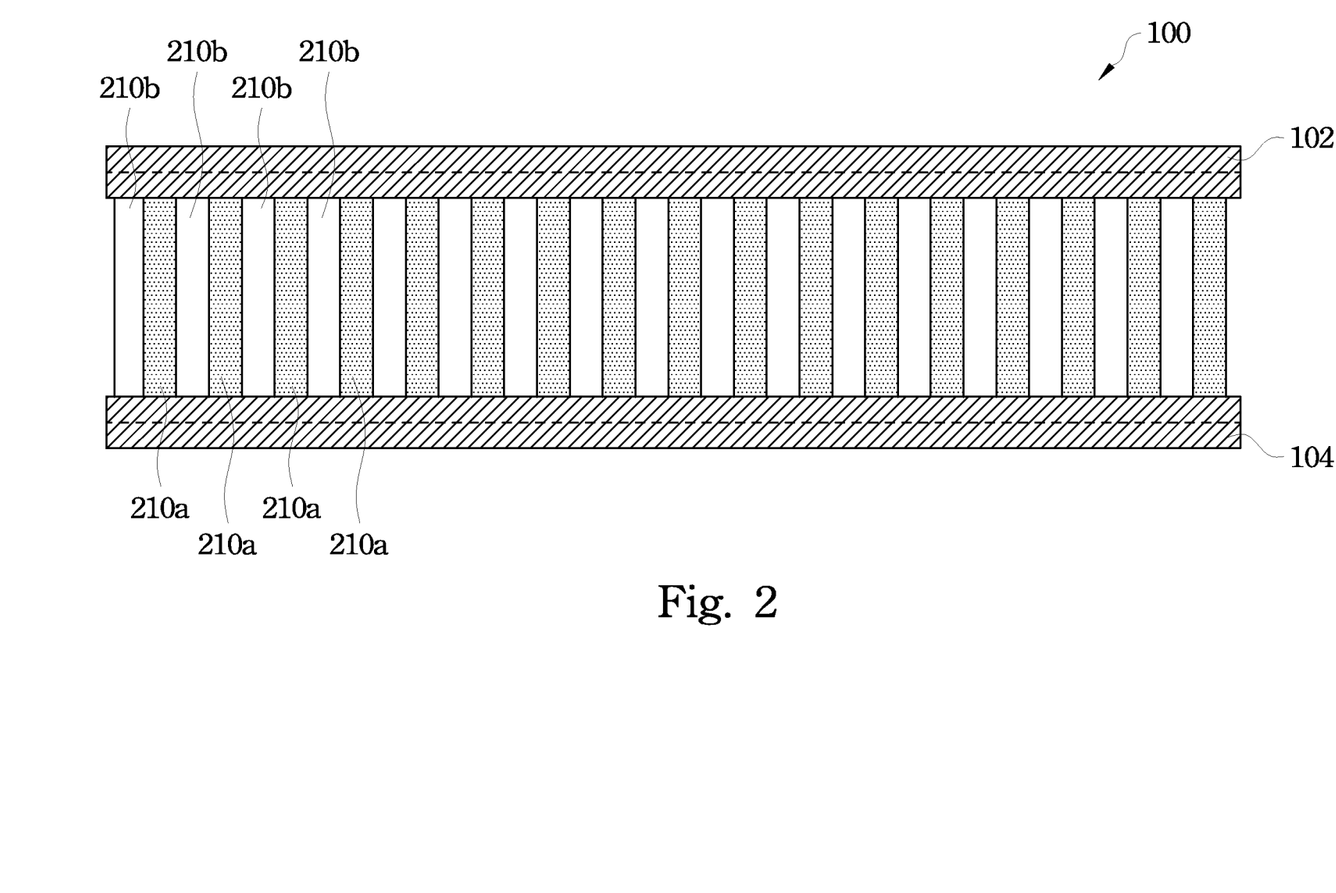

FIG. 2 illustrates the placement area 100 after the assignment of alternating sites 210a (illustrated by the white sites) and 210b (illustrated by the shaded sites) in accordance an embodiment. Generally, the placement area 100 is divided into a plurality of alternating sites, wherein the number of different sites corresponds to the number of masks. For example, FIG. 2 illustrates the placement area 100 assigned sites 210a and 210b arranged in an alternating manner. Sites 210a correspond to a first mask, and sites 210b correspond to a second mask. The width of each site is such that separate features placed in subsequent sites of the same type (e.g., two subsequent sites 210b) are not too close together such that both features may not be patterned with sufficient accuracy. The width of each site may be based upon, for example, a poly pitch (a width of the poly+a space between adjacent poly features) of the device. Other embodiments, however, may base the width of each site on the critical dimension, a minimum spacing given the limits of the lithography system, and/or the like. For convenience, the alternating sites may be allocated different colors, shading, or the like to provide a visual aid during the layout process. For example, embodiments may utilize an electronic utility, e.g., an EDA tool, and the tool may color the alternating sites differently to visually aid the designer in the design and placement co-design of the cells.

Figure 3:
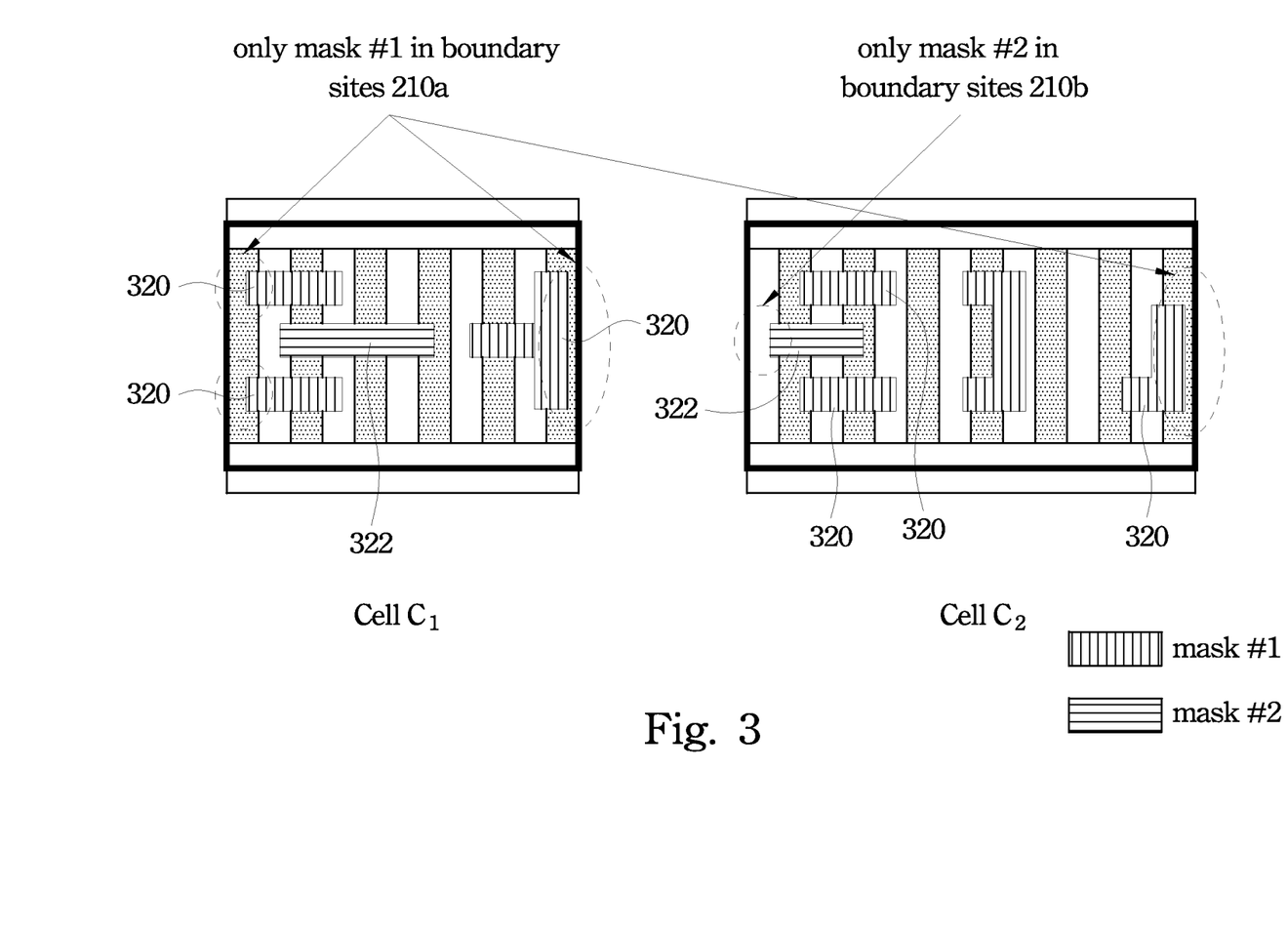

FIG. 3 illustrates a layout of cell $C_1$ and cell $C_2$ in accordance with an embodiment. Each of cell $C_1$ and cell $C_2$ includes patterns allocated to a first mask (shapes illustrated as solid black shapes) as well as patterns allocated to a second mask (shapes illustrated as solid white shape). During the layout process, a length of each cell $C_1$ and cell $C_2$ determines a number of alternating sites needed for each cell. The cells $C_1$ and $C_2$ are then placed such that boundary sites (e.g., sites located on the ends of the cells) include patterns associated with the corresponding mask.

For example, in the embodiment illustrated in FIG. 3, sites 210a are associated with the first mask, and sites 210b are associated with the second mask. The cell $C_1$ includes portions 320 that are part of the first mask, and also includes portions 322 that are part of the second mask. The cell $C_1$ is designed such that the boundary sites include only patterns associated with the mask corresponding to the site. In this example, the boundary sites are 210a, which corresponds to the first mask. Accordingly, the boundary sites 210a are only allowed to include patterns defined by the first mask.

Similarly, the boundary sites of cell $C_2$ are site 210b along the left boundary and site 210a along the right boundary. Because the site 210b is associated with the second mask, only patterns defined by the second mask are allowed within the leftmost boundary site 210b. The rightmost boundary site 210a is associated with the first mask, so only patterns defined by the first mask are allowed within the rightmost boundary site.

Figure 4:
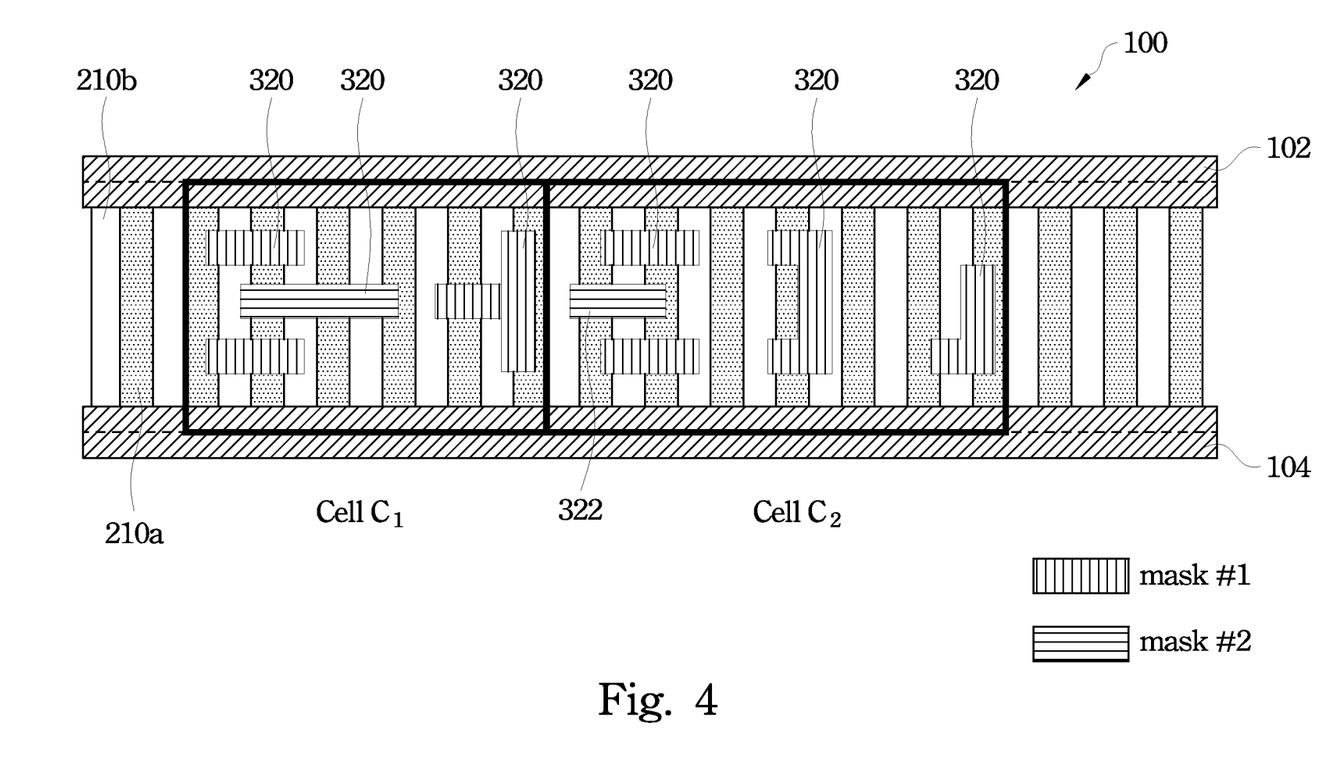

FIG. 4 illustrates a placement of the cells $C_1$ and $C_2$ in accordance with an embodiment. Once designed, the cells are placed such that the boundary cells alternate between sites 210a and 210b. For example, the rightmost boundary site of cell $C_1$ is site 210a, and the leftmost boundary site of cell $C_2$ is site 210b. When the cell $C_1$ is placed adjacent to cell $C_2$, the designer is assured that the patterns defining the shapes in cell $C_1$ will not interfere with the patterns defining the shapes in cell $C_2$, regardless of which mask is used to define the various shapes and without the need to insert unnecessary buffer areas along the boundaries.

Figure 5:
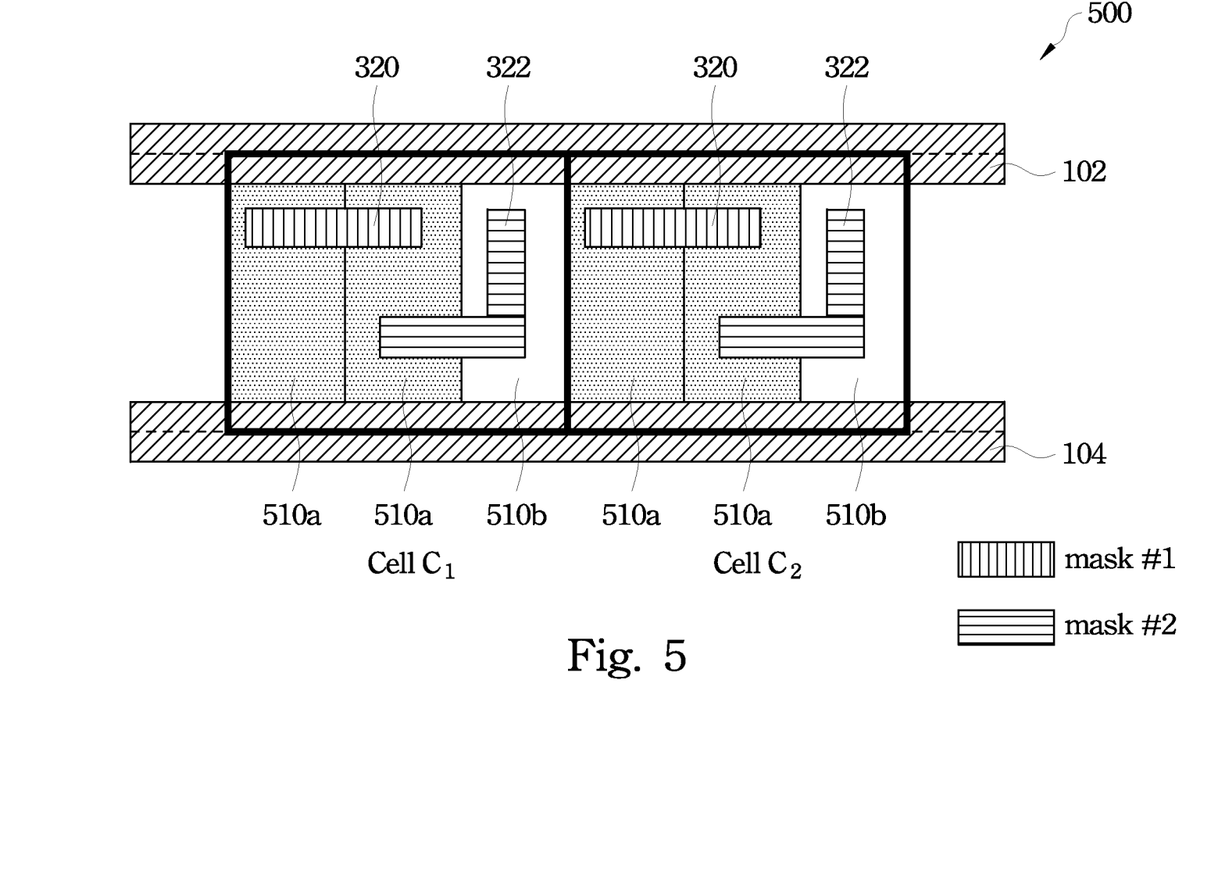
FIG. 5 illustrates a cell placement in accordance with another embodiment.

FIG. 5 illustrates a cell placement area 500 in accordance with another embodiment, wherein like reference numerals refer to like elements. In this embodiment, while the cell placement area 500 is divided into different sites corresponding to the different masks, the placement of the sites does not alternate in a one-and-one manner. Rather, as illustrated in FIG. 5, sites 510a, corresponding to a first mask, and sites 510b, corresponding to the second mask, alternate such that two sites 510a are placed adjacent to each other followed by a site 510b. In this manner, the pattern is a repeating pattern of site 510a-site 510a-510b.

In this embodiment, the boundary sites between the cells alternate. For example, as illustrated in FIG. 5, the boundary site of cell $C_1$ along the cell $C_1$-cell $C_2$ border is site 510b, and the boundary site of cell $C_2$ along the cell $C_1$-cell $C_2$ border is site 510a. By maintaining the alternating sites along the cell boundaries, a designer is assured that the shapes in cell $C_1$ will not interfere with the shapes in cell $C_2$.

The examples discussed above oriented alternating sites in a single direction, e.g., along the horizontal direction. Other embodiments may provide placement along additional axes, such as along the vertical direction. In this example, the device site 100 may be divided into vertical sites to aid in the cell layout along the horizontal direction, and the device site 100 may be divided into horizontal sites to aid in the cell layout along the vertical direction.

Figure 6:
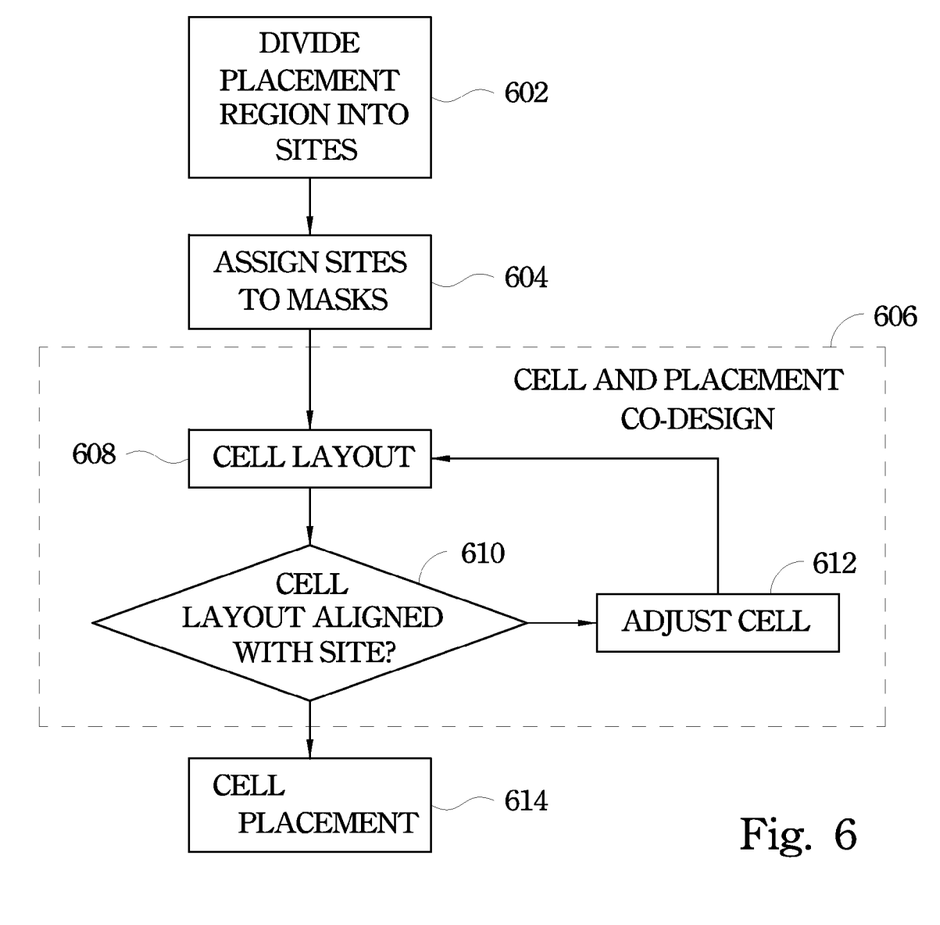
FIG. 6 is a process flow diagram illustrating a cell layout process in accordance with an embodiment.

FIG. 6 is a flow chart that summarizes a process performed in accordance with an embodiment. The process begins in step 602 wherein a placement area (e.g., placement area 100 of FIG. 1) is separated into sites, wherein the number of different types of sites corresponds to the number of masks being used in the lithography process. In step 604, the different types sites are assigned to one of the masks. For example, with reference to FIG. 2, the sites 210a may be assigned to the first mask and the sites 210b may be assigned to a second mask. When using an electronic tool, such as an EDA tool, it may be desirable to utilize different colors, or other visual indication, to identify the different sites.

In step 606, indicated by a dotted rectangle, a cell and placement co-design process is performed. By analyzing the type of sub-patterns within cell boundaries, cell designers decide which color of sites the cell boundary would be placed. According to the site-mask assignment performed in step 604, the cell designers can rely on the sub-patterns surrounding this cell not conflicting with the current cell as long as the alternating site pattern is maintained along the cell boundaries, thereby maintaining a sufficient buffer between patterns in the same mask, but in different cells, and possibly saving cell area. In some embodiments, such as those illustrated in FIG. 5, may include placing the same type of sites adjacent to each other.

In some situations, however, a redesign process may be desirable to adequately match the boundary sites to the corresponding masks. The redesign process may include, for example, reassigning the patterns to different mask levels, modifying the locations of the patterns, adding a buffer area to increase the cell length and change the type of boundary site, or the like.

The cell and placement co-design process may be an iterative process. For example, the co-design step 606 may begin with a cell layout process as indicated in step 608, wherein the cell pattern is aligned with the sites. In step 610, a determination is made whether or not the cell layout is correctly aligned with the alternating sites. If not, as indicated in step 612 the cell may be adjusted as discussed above. The process may then return to step 608 to repeat the cell layout step.

Next, in step 614, the cells are placed, or arranged, to create a mask level layout such that the adjoining cells maintain alternating sites.

It is noted that, unless indicated otherwise, all functions described herein may be performed in either hardware or software, or some combination thereof, with or without human intervention. In an embodiment, however, the functions are performed by a processor such as a computer or an electronic data processor, such as that discussed below with reference to FIG. 6, in accordance with code such as computer program code, software, and/or integrated circuits that are coded to perform such functions, unless indicated otherwise.

Figure 7:
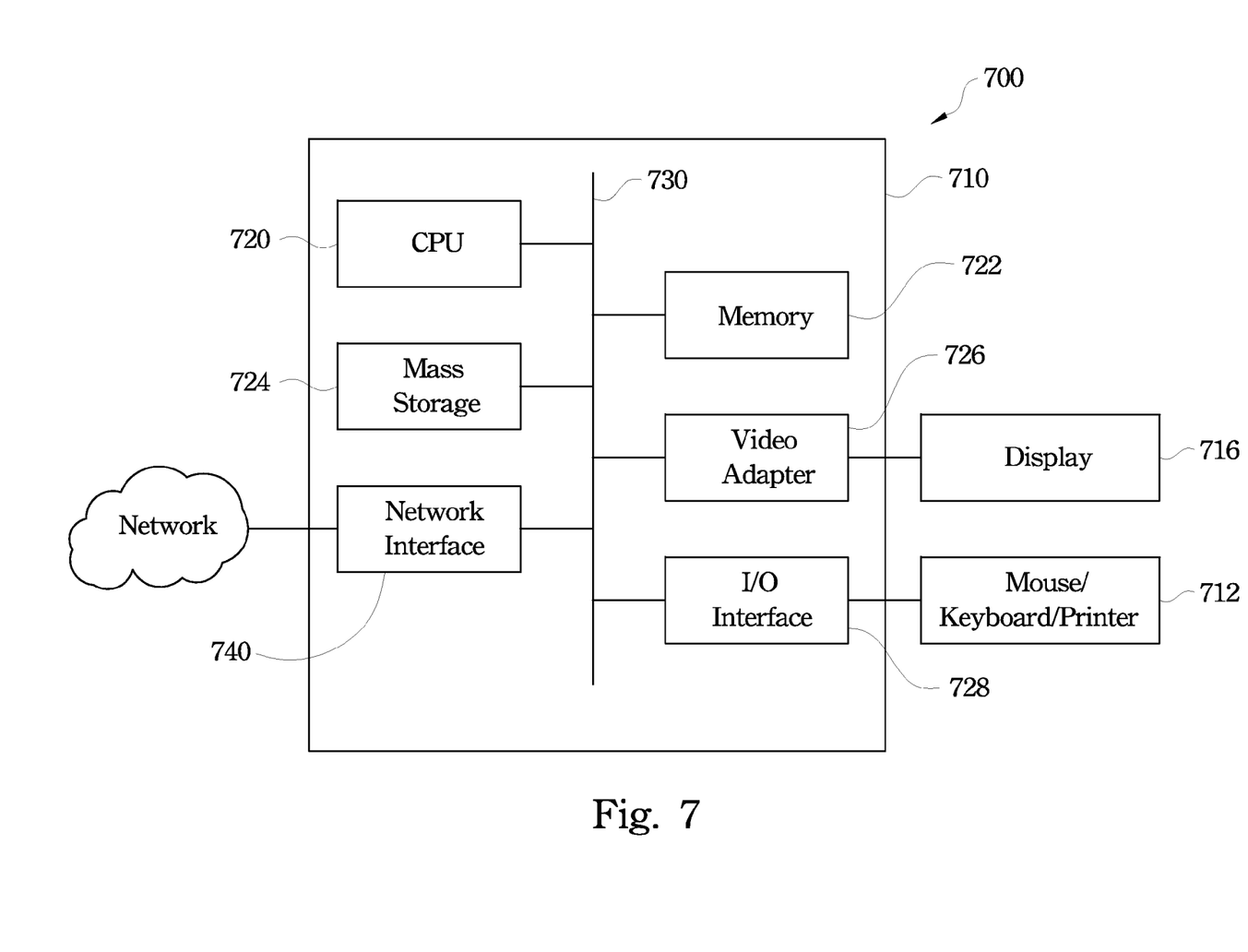
FIG. 7 is a block diagram of a processing system in accordance with an embodiment.

Referring now to FIG. 7, a block diagram of a processing system 700 that may be used to perform one or more of the processes discussed above in accordance with an embodiment. The processing system 700 may comprise a processing unit 710 equipped with one or more input/output devices 712, such as a mouse, a keyboard, printer, or the like, and a display 716. The processing unit 710 may include a central processing unit (CPU) 720, memory 722, a mass storage device 724, a video adapter 726, and an I/O interface 728 connected to a bus 730.

The bus 730 may be one or more of any type of several bus architectures including a memory bus or memory controller, a peripheral bus, video bus, or the like. The CPU 720 may comprise any type of electronic data processor. The memory 722 may comprise any type of system memory such as static random access memory (SRAM), dynamic random access memory (DRAM), synchronous DRAM (SDRAM), read-only memory (ROM), a combination thereof, or the like. In an embodiment, the memory 722 may include ROM for use at boot-up, and DRAM for data storage for use while executing programs.

The mass storage device 724 may comprise any type of storage device configured to store data, programs, and other information and to make the data, programs, and other information accessible via the bus 730. The mass storage device 724 may comprise, for example, one or more of a hard disk drive, a magnetic disk drive, an optical disk drive, or the like.

The video adapter 726 and the I/O interface 628 provide interfaces to couple external input and output devices to the processing unit 610. As illustrated in FIG. 7, examples of input and output devices include the display 716 coupled to the video adapter 626 and the mouse/keyboard/printer 712 coupled to the I/O interface 728. Other devices may be coupled to the processing unit 710, and additional or fewer interface cards may be utilized. For example, a serial interface card (not shown) may be used to provide a serial interface for a printer.

The processing unit 710 also preferably includes a network interface 640, which may be a wired link, such as an Ethernet cable or the like, and/or a wireless link. The network interface 740 allows the processing unit 710 to communicate with remote units via the network. In an embodiment, the processing unit 710 is coupled to a local-area network or a wide-area network to provide communications to remote devices, such as other processing units, the Internet, remote storage facilities, or the like.

It should be noted that the processing system 700 may include other components. For example, the processing system 700 may include power supplies, cables, a motherboard, removable storage media, cases, and the like. These other components, although not shown, are considered part of the processing system 700.

Figure 8:
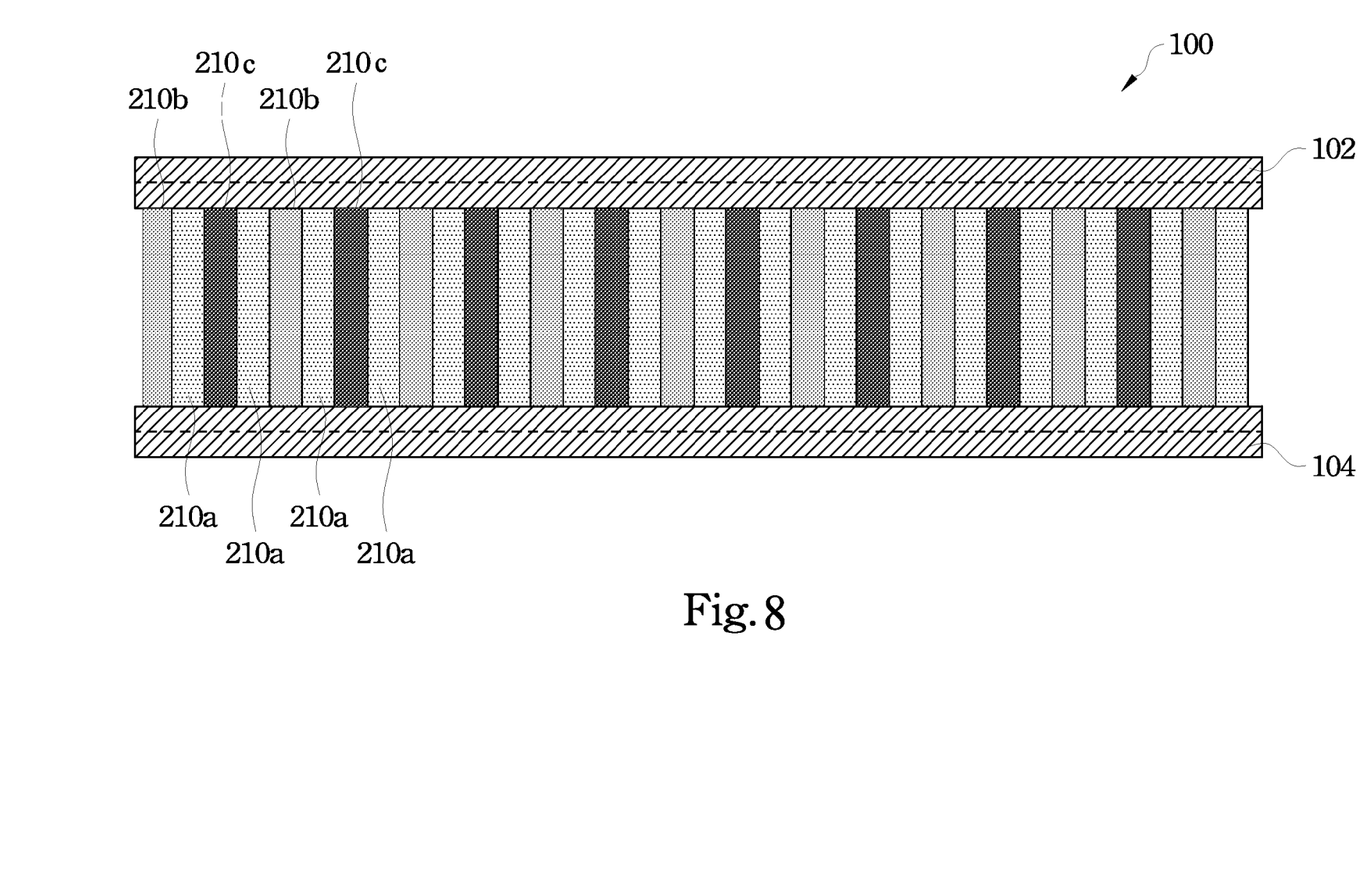
FIG. 8 illustrates the placement area after assignment of sites in accordance with another embodiment.

While the embodiments discussed above illustrate embodiments in which two types of sites are used, other embodiments may utilize more than two types of sites and masks. For example, FIG. 8 illustrates an embodiment in which three types of sites 201a, 210b, and 210c are utilized.

In accordance with an embodiment, a method comprising designating a plurality of sites in a placement region as either a first site or a second site such that the first site and the second site alternate. The type of sub-patterns, defined by a first mask and a second mask, of a cell are analyzed. The first site and the second site are associated with a first mask and a second mask, respectively, and a determination is made whether the boundary sites of the cell include patterns defined by a mask not associated with the boundary site.

In accordance with another embodiment, a method comprising receiving a plurality of cell definitions, each of the cell definitions including an indication of boundary sites, each of the boundary sites indicating one of a plurality of masks, each of the cell definitions further including a cell layout and placing a first cell adjacent to a second cell such that a boundary site of the first cell is not of a same type as a boundary site of the second cell is provided.

In accordance with yet another embodiment, a computer program is provided, wherein the computer program includes computer program code for receiving a placement region, indicating a plurality of sites in the placement region, the plurality of sites being separated into a plurality of types of sites, the plurality of types of sites alternating in the placement region, indicating in which sites cell patterns are placed, and placing cell patterns within the placement region such that boundary sites of adjacent cells are different.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
providing a design of a plurality of cells, each cell including one or more first sites and one or more second sites and patterns comprising a first pattern set associated with a first mask and a second pattern set associated with a second mask;
arranging the plurality of cells, after providing the design of the plurality of cells, in a placement region such that adjacent cells have a portion of a pattern from a single pattern set in each boundary site, and boundary sites of adjacent cells alternate between the first site and the second site;
associating patterns in boundary sites of the first site with a first mask layout and associating patterns in boundary sites of the second site with a second mask layout; and
creating the first mask using the first mask layout and the second mask using the second mask layout, the first mask configured to print a pattern according to the first mask layout, and the second mask configured to print a pattern according to the second mask layout.

2. The method of claim 1, wherein each cell includes one or more third sites.

3. The method of claim 1, wherein a width of the first site and the second site is based upon a poly pitch.

4. The method of claim 1, wherein the first site and the second site are assigned different colors.

5. The method of claim 1, further comprising modifying sub-patterns of a pattern set of one or more cells in order to maintain alternating boundary sites.

6. The method of claim 5, wherein the modifying includes modifying the first mask layout and the second mask layout.

7. The method of claim 1, wherein any one cell may have adjacent sites associated with a same mask layout.

8. A method comprising:
receiving a plurality of cell definitions, each of the cell definitions including an indication of boundary sites, each of the boundary sites indicating one of a plurality of site types, each of the cell definitions including a cell layout having a plurality of pattern sets each associated with one of a plurality of masks;
placing, in a placement region having sites of a plurality of site types each associated with one of a plurality of mask layouts, a first cell adjacent to a second cell such that a boundary site of the first cell is not of a same site type as an adjacent boundary site of the second cell and such that the boundary site of the first cell has pattern sets disposed therein different from the pattern sets disposed in the boundary site of the second cell; and
creating a plurality of masks, each mask created according to one of the plurality of mask layouts and being associated with one of the plurality of site types and configured to print a photolithographic pattern according to a cell definition indicating an associated site type, wherein all patterns within a boundary site are allocated to a single mask.

9. The method of claim 8, wherein a width of the boundary site is based upon a poly pitch.

10. The method of claim 8, wherein each of the plurality of masks are assigned a unique site identifier.

11. The method of claim 10, wherein the unique site identifier is a color.

12. The method of claim 8, further comprising modifying one or more of the cell definitions.

13. The method of claim 12, wherein the modifying includes modifying a layout of a mask.

14. The method of claim 12, wherein the modifying includes increasing a size of the cell.

15. The method of claim 8, wherein the first cell has adjacent cells of a same type.

16. A computer program product, the computer program product having a non-transitory, computer-readable medium with a computer program embodied thereon, the computer program comprising:

computer program code for receiving a placement region, the placement region having a plurality of site sets, each of a different site type, each site type associated with a different mask;

computer program code for indicating a plurality of sites in each of a plurality of cells, the plurality of sites being separated into a plurality of types of sites, each of the plurality of cells having a plurality of patterns each of a different pattern type; and computer program code for placing cell patterns in sites within the placement region such that boundary sites of adjacent cells are of different site types and such that adjacent boundary sites of adjacent cells have patterns with different pattern types.

17. The computer program product of claim 16, wherein the sites types are visually indicated on a display.

18. The computer program product of claim 17, wherein the sites types are visually indicated by different colors.

19. The computer program product of claim 16, wherein a first cell pattern includes adjacent sites of a same type.

\* \* \* \* \*